(12) United States Patent
Tripsas et al.

(10) Patent No.: US 7,199,416 B1
(45) Date of Patent: Apr. 3, 2007

(54) SYSTEMS AND METHODS FOR A MEMORY AND/OR SELECTION ELEMENT FORMED WITHIN A RECESS IN A METAL LINE

(75) Inventors: Nicholas H. Tripsas, San Jose, CA (US); Minh Tran, Milpitas, CA (US); Jeffrey Shields, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 10/985,172

(22) Filed: Nov. 10, 2004

(51) Int. Cl.
 *H01L 27/108* (2006.01)
 *H01L 23/58* (2006.01)

(52) U.S. Cl. .............. 257/301; 257/594; 257/E27.091; 257/E27.095

(58) Field of Classification Search ................. 257/301
See application file for complete search history.

(56) References Cited

U.S. PATENT DOCUMENTS

2002/0102839 A1 * 8/2002 Gonzalez et al. ........... 438/629
2005/0184327 A1 * 8/2005 Ozawa ....................... 257/302

* cited by examiner

*Primary Examiner*—Tu-Tu Ho
(74) *Attorney, Agent, or Firm*—Amin, Turocy, & Calvin, LLP

(57) ABSTRACT

The subject invention provides systems and methodologies for fabrication of memory and/or selection (e.g., diodes) elements in a recession in a semiconductor layer. In particular, a trench of varying width is created in the semiconductor layer by employing various etching techniques. A metal film can be deposited in the trench according to a desired deposition thickness in order to seam close a narrow portion of the trench while form a dimple in a wide portion of the trench. The trench, after metal film deposition, exhibits a depression in wider trench portions relative to narrow trench portions. The depression can be utilized by placing one or more memory or selection layers in the depression, and a via can be formed over a portion of the trench to form an interconnect.

17 Claims, 8 Drawing Sheets

SYSTEMS AND METHODS FOR A MEMORY AND/OR SELECTION ELEMENT FORMED WITHIN A RECESS IN A METAL LINE

FIELD OF INVENTION

The subject invention generally relates to semiconductor fabrication and, in particular, to systems and methodologies for forming memory and/or selection elements in a metal line recess that was intentionally created during metal line formation.

BACKGROUND OF THE INVENTION

The proliferation and increased usage of portable computer and electronic devices has greatly increased demand for memory cells. Digital cameras, digital audio players, personal digital assistants, and the like generally seek to employ large capacity memory cells (e.g., flash memory, smart media, compact flash, or the like). Memory cells can be typically employed in various types of storage devices. Storage devices include long term storage mediums such as, for example, hard disk drives, compact disk drives and corresponding media, digital video disk (DVD) drives, and the like. The long term storage mediums typically store larger amounts of information at a lower cost, but are slower than other types of storage devices. Storage devices also include memory devices which are often, but not always, short term storage mediums.

In addition, memory cells can generally be subdivided into volatile and non-volatile types. Volatile memory generally requires periodic refresh cycles in order to maintain information. Such memory cells include, for example, random access memory (RAM), dynamic RAM (DRAM), synchronous RAM (SRAM) and the like. Unlike volatile memory, non-volatile memory cells typically maintain information when power is removed. Examples of non-volatile memory cells include; read only memory (ROM), programmable ROM (PROM), erasable programmable ROM (EPROM), electrically erasable programmable ROM (EEPROM), flash memory, and the like. Volatile memory cells generally provide faster operation at a lower cost as compared to non-volatile memory cells. Nonetheless, to retain the information, the stored data typically must be refreshed.

Memory cells within a memory device can be accessed or "read" to retrieve stored information, "written" to store information, and "erased" to remove stored information. In general, memory cells maintain information in an "off" or an "on" state, also referred to as "0" and "1". Typically, a memory device is addressed to retrieve a specified number of byte(s) (e.g., 8 memory cells per byte, 16 memory cells per word . . . ). As noted above, with volatile memory devices memory cells must be periodically "refreshed" in order to maintain state. Such memory devices usually are fabricated from semiconductor structures that perform various functions and that are capable of switching and maintaining the two states. Such devices are often fabricated with inorganic solid state technology, such as, crystalline silicon devices. A common semiconductor device employed in memory devices is the metal oxide semiconductor field effect transistor (MOSFET).

Increasing demand for information storage has lead memory device manufacturers to continuously research and develop technology that increases speed and storage retrieval of memory devices (e.g., increase write/read speed). At the same time, to reach high storage densities, manufacturers typically focus on scaling down semiconductor device dimensions (e.g., at sub-micron levels). Nonetheless, formation of various transistor type control devices that are typically required for programming memory cell arrays increase costs and reduces efficiency of circuit design. Therefore, there is a need to reduce structural complexities of conventional memory devices and simplify fabrication processes of memory devices. In addition, a typical fabrication process requires etching (e.g., of copper) and a deposition processes with good gap-fill capability for both dielectric and metal layers. Conventional metal etch and dielectric gap-fill techniques present challenges in the drive towards smaller semiconductor dimensions.

SUMMARY OF THE INVENTION

The following presents a simplified summary of the invention in order to provide a basic understanding of one or more aspects of the invention. This summary is not an extensive overview of the invention. It is not intended to identify key, as well as critical, elements of the invention, or to delineate its scope. Rather, the sole purpose of this summary is to present some concepts of the invention in a simplified form as a prelude to the more detailed description that is presented hereinafter.

The subject invention provides for a system and methodology for formation of a memory and/or selection elements in a recess in a metal line, which can reduce structural complexity of memory devices and decrease utilization of masks in fabrication of conventional systems. According to one aspect of the invention, a variable width trench is formed on a dielectric layer. The trench is filled with a metal film (e.g. electrochemical plated copper), wherein narrower portions of the trench are substantially filled with metal, while wider areas of the trench are partially filled. By not completely filling the wider areas of the trench, a dimple is created. The metal film is polished, and a memory device layer(s) is deposited in the dimple. After polishing, an interconnect can be formed with a via that contacts a surface of the memory device. Alternatively, a selection element (e.g., a diode) can be formed instead of the memory element by utilizing a substantially similar approach. In particular, a selection element can be deposited within the dimple in the metal line trench, and after polishing, an interconnect can be formed by placing a via over the metal line trench such that it contacts a surface of the selection element.

To the accomplishment of the foregoing and related ends, the invention, then, comprises the features hereinafter fully described. The following description and the annexed drawings set forth in detail certain illustrative aspects of the invention. However, these aspects are indicative of but a few of the various ways in which the principles of the invention may be employed. Other aspects, advantages and novel features of the invention will become apparent from the following detailed description of the invention when considered in conjunction with the drawings. To facilitate the reading of the drawings, some of the drawings may not have been drawn to scale from one figure to another or within a given figure.

DETAILED DESCRIPTION OF THE INVENTION

Figure 1:
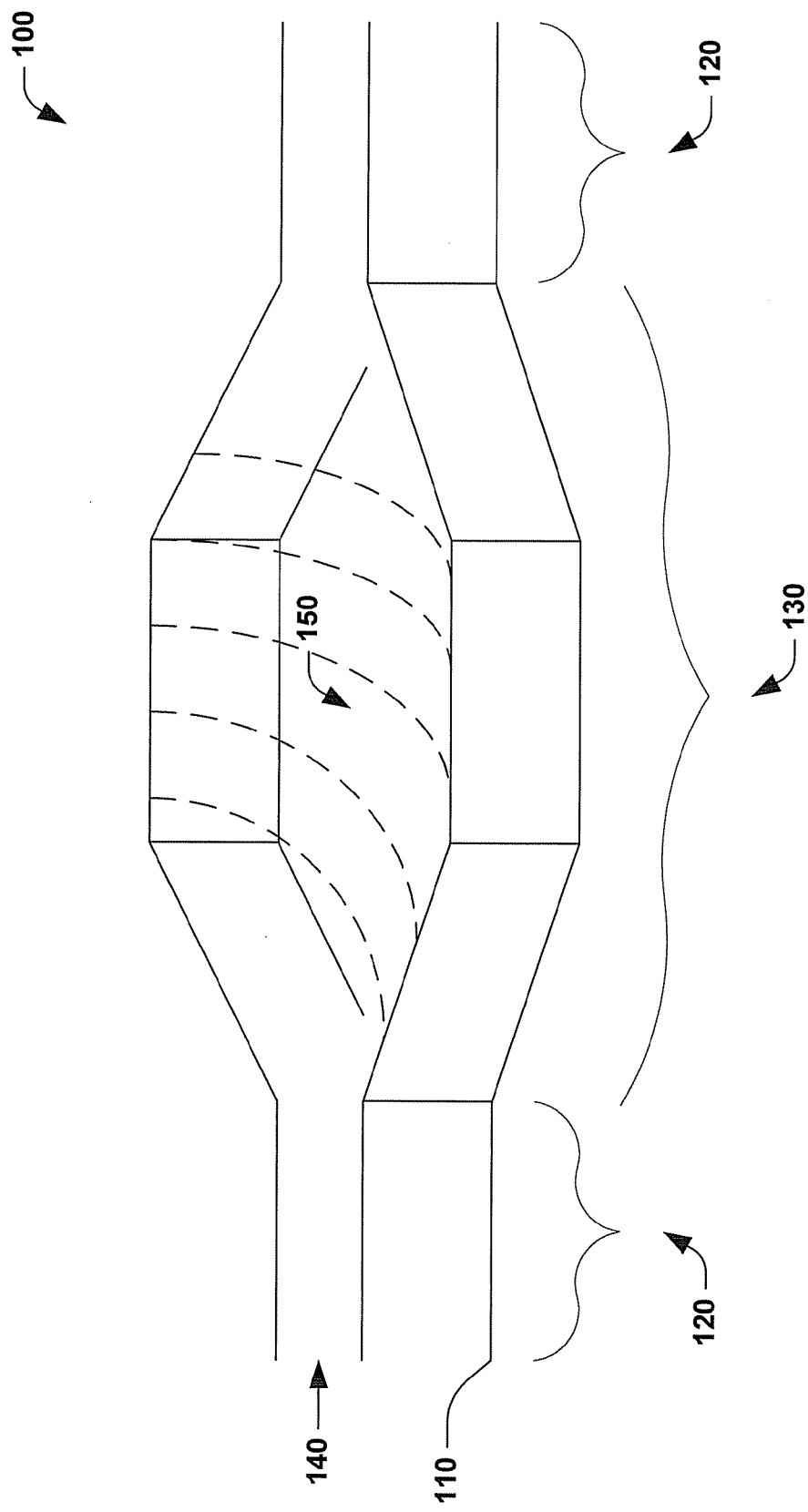
FIG. 1 illustrates a three-dimensional perspective of a portion of a memory element with a metal line formed within narrow and wide regions of a trench therein, wherein the metal line within the wide region is formed to create a dimple.

The subject invention is now described with reference to the drawings, wherein like reference numerals are used to refer to like elements throughout. In the following description, for purposes of explanation, numerous specific details are set forth in order to provide a thorough understanding of the subject invention. It may be evident, however, that the subject invention may be practiced without these specific details.

As utilized in this application, the terms "component," "system," "unit," "data," "controller," and the like are intended to refer to computer-related entities, including hardware, firmware or software, a combination thereof, and/or executing software. For example, a component may be, but is not limited to being, a process running on a processor, a processor, an object, an executable, a thread of execution, a program, and a computer. By way of illustration, both an application running on a server and the server can be a component. One or more components may reside within a process and/or thread of execution and a component may be local to one computer and/or distributed between two or more computers.

The subject invention provides for a system and methodology for formation of a memory element and/or selection element (e.g., diode) in a recession in a metal line. Such recession, or indentation, can be formed within a damascene metal line trench. Preparation of the metal line trench can result in a trench varying in width (e.g., narrow regions and wide regions). A metal film can be deposited in the trench such that narrow regions are substantially filled with the metal film, whereas wide regions are partially filled, thereby forming the recession therein. Thus, an indentation (e.g. dimple, recession . . . ) in the metal line trench is created relative to the narrow areas of the trench and layer surface. Once metal film deposition is terminated, a polishing or other process can be applied to the metal film. It is understood that a variety of metal film polishing techniques known to the art is acceptable. This indentation can be utilized during memory and/or selection element fabrication by setting one or more memory and/or selection layers in the indentation. After this layer undergoes any polishing, a via can be formed over the memory and/or selection layer.

Referring initially to FIG. 1, a portion of a memory element 100 with a metal line trench 110 with narrow regions 120 and a wide region 130 is illustrated. Both the narrow regions 120 and the wide region 130 can have predetermined widths. It is also to be appreciated that regions 120 and 130 can be comprised of one or more layers of insulators, dielectrics, barriers, and metal interconnects, and/or passivization layers formed on a substrate. The metal line trench 110 is depicted as having a metal film 140 deposited in both the narrow regions 120 and the wide region 130. According to one aspect of the invention, electrochemical plated copper (ECP Cu) is deposited into the narrow regions 120 and the wide region 130. Such deposition can be associated with a desired deposition thickness, wherein in the wide region 130 the deposition can result in a dimple 150 (e.g., depression), while the narrow regions 120 are substantially filled by seam formation. The dimple 150 can be utilized to form a memory and/or selection element. By creating the dimple 150 and forming a memory and/or selection element in the dimple 150 rather than forming a subsequent layer and utilizing a mask to form a recession, structural complexities of conventional memory devices can be reduced, which can simplify memory device fabrication. In addition, the number of mask layers can be reduced and a good gap-fill can be achieved, which can lead to smaller semiconductor dimensions.

Figure 2:
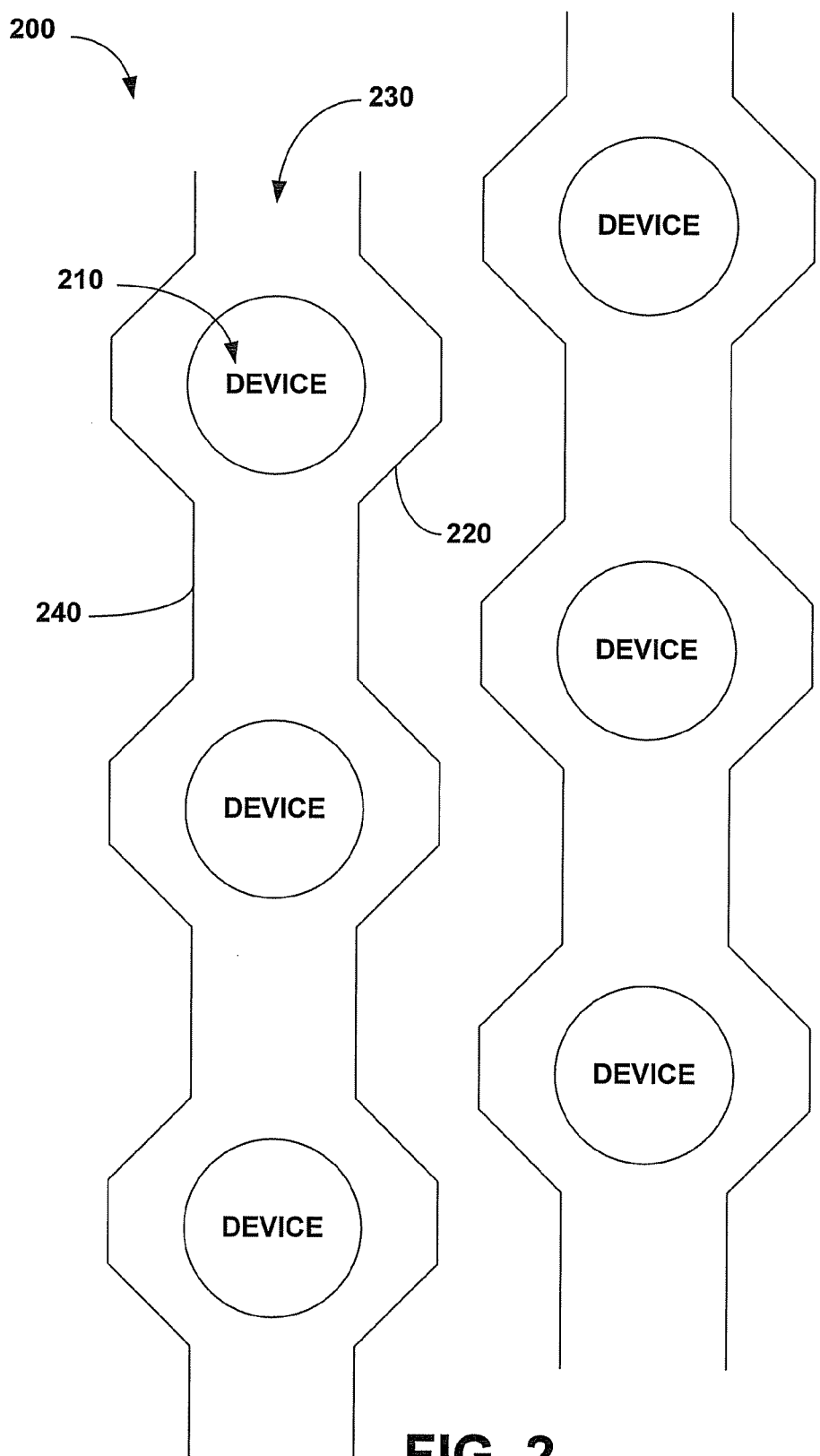
FIG. 2 illustrates a top view of a semiconductor with multiple memory devices formed in accordance with an aspect of the invention.

FIG. 2 illustrates a top view of a memory structure 200 with multiple memory devices 210 (or, alternatively, selection elements) formed within wide regions 220 of a metal line trench 230 that additionally comprises narrow regions 240. Respective memory devices 210 can be formed as defined in connection with FIG. 1. For example, the metal line trench 230 can be formed over a substrate comprising one or more layers of insulators, dielectrics, barriers, metal interconnects, passivization layers, etc. The wide regions 220 and the narrow regions 240 of the metal line trench 230 can be filled with an electrochemical plated copper (ECP Cu) metal film deposition. The technique employed can be such that the narrow regions 240 are substantially filled, whereas the wide regions 220 are partially filled to create a dimple (not shown). As depicted, one or more memory devices can be formed within the dimples. Alternatively, one or more selection elements (not shown) can be formed within the dimples. As noted above, such an approach can reduce structural complexities of conventional memory devices, simplify the memory device fabrication process, reduce mask layers, provide good gap-fill, and/or facilitate generating smaller semiconductor dimensions.

Figure 3:
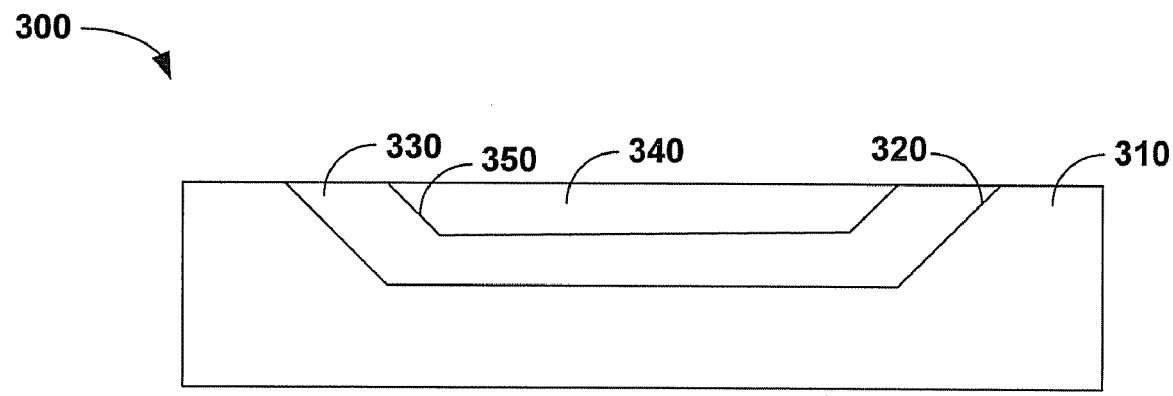
FIG. 3 illustrates a cross-sectional view of a memory device deposited in a dimple created by partially filling a wide area of a metal line trench within a dielectric layer.

FIG. 3 illustrates a memory structure 300 with a dielectric layer 310, a metal line trench of varying width 320, a metal film deposition 330, and a memory device 340. Alternatively, a selection element (not shown) can be formed instead of the memory device 340. It is to be appreciated that the memory device 340 can be a single device layer and/or a plurality of device layers set into the trench 320 over the metal film deposition 330. The structure 300 includes a recession 350 in the metal line trench 320 that is created as described herein. The metal film 330 can be, for example, ECP Cu. Although the dimensions of the structure 300 can result in the memory device 340 and parts of the deposition 330 being substantially flush with a surface of the layer 310, it is understood that these characteristics are not fully demonstrative of all aspects of the invention.

Figure 4:
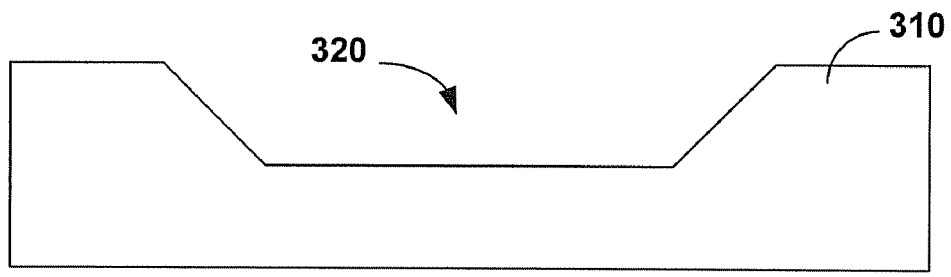
FIG. 4 illustrates a cross-sectional view of a dielectric layer with a metal line trench.
Figure 5:
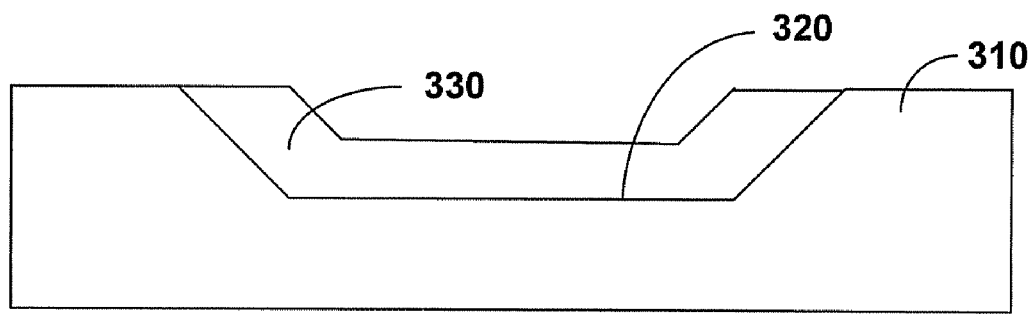
FIG. 5 illustrates a cross-sectional view of a metal line with a dimple created by partially filling wider areas of a metal line trench in a dielectric layer.
Figure 6:
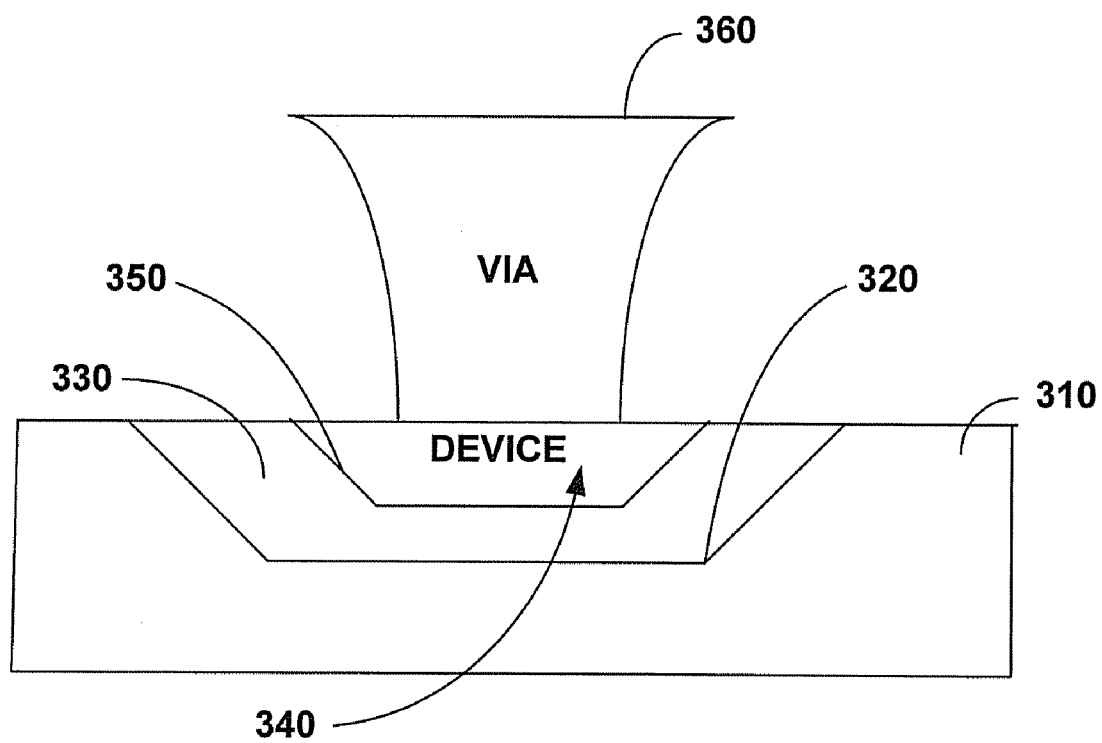
FIG. 6 illustrates a cross-sectional view of a memory device deposited in a dimple with an optional via that forms an interconnect memory device.

FIGS. 4–6 illustrate formation of the memory structure 300 in accordance with an aspect of the subject invention. In FIG. 4, the dielectric layer 310 and trench 320 are formed. The dielectric layer 310 can be, for example, a deposited oxide, silicon nitride, or a polyimide film. In addition, organic and inorganic dielectric materials can be used. Similarly, both low and high k dielectrics can be used. Also polymeric, amorphous, crystalline and monomeric materials can be used in accordance with aspects of the subject invention. Examples of dielectric materials include silicon containing spin-on glasses such as alkoxysilane polymer, a siloxane polymer, a silsesquioxane polymer, a poly(arylene ether), a fluorinated poly(arylene ether), other polymer dielectrics, nanoporous silica or mixtures thereof. Optionally, prior to formation of dielectric layer 310, one or more layers of insulators, barriers, metal interconnects, and/or passivization layers can be formed.

The dielectric layer 310 can be formed by any suitable technique. For example, chemical vapor deposition (CVD), plasma enhanced chemical vapor deposition (PECVD), low pressure chemical vapor deposition (LPCVD), or high pressure chemical vapor deposition (HPCVD) methods can be used. Polymeric dielectrics can also be formed by using spin-coating, dip-coating, spraying, or roller coating. The dielectrics can be deposited to a thickness suitable to facilitate via formation and subsequent fabrication procedures. For example, dielectrics can be deposited to a thickness from about 1000 Å to about 50,000 Å. The dielectric layer 310 can be deposited over substantially the entire or a portion of a substrate. Optionally, the dielectric layer 310 can be heated, for example, at a temperature from about 80° C. to about 500° C. The duration of heating can range from about 1 minute to about 10 hrs.

The trench 320 is formed within the dielectric layer 310. The trench 320 can be etched onto the dielectric layer 310 and can vary in width. In one aspect of the invention, the trench 320 can be recessed to a level sufficient to form memory elements or diodes (e.g., selection elements) in a suitable formation process. Any suitable method can be utilized to recess the dielectric layer 310. As an example, etching can be accomplished either by a wet etch or a dry etch. In one aspect of the subject invention, the metal recess is achieved by performing a plasma etch, wet etch, or electro polishing, following a conventional chemical mechanical polishing step. In another aspect of the subject invention, the metal recess is formed using a reactive ion etching process. In yet another aspect, the recess is formed by using a wet etchant in a spin-etch process. In such a spin-etch process, the layer 310 is placed on a chuck, rotated at a suitable speed such as 100 rpm, and the etchant dispersed onto the dielectric 310. The etch process is typically carried out for a time of 1–60 seconds in duration. The etch is followed by a cleaning step.

The etchant chemistry employed to recess the dielectric layer 310 depends on the etch requirements. In one instance, a peroxide based etchant is used. In another instance, an acid based etchant is used. In yet another instance, an etchant containing both an acid and peroxide is used. For example, a mixture of sulfuric acid and hydrogen peroxide can be used as a wet etchant. The etch rate can be adjusted to obtain proper etching. In one example, an etch rate from about 0.5 to about 10 µm/min is employed. The etching can be either isotropic or anisotropic. The temperature at which the etch is carried out ranges from about 10° C. to 100° C. The amount of material to be recessed is determined by the thickness requirements of subsequently formed memory element films and device layers. Typically, the recess is from about 100–10,000 Å in depth and is approximately ¼ to ⅓ the depth of the via opening.

FIG. 5 depicts formation of a metal film deposition 330 in the metal line trench 320. The metal film 330, for example, can be electrochemical plated copper (ECP Cu). In addition, the deposition of the metal film 330 can be applied to create a recession relative to a surface of the dielectric layer 310. As previously described, narrow portions of the trench 320 can be substantially filled with ECP Cu and, hence, can have a metal film deposition about level to the surface of the dielectric layer 310.

In FIG. 6, a memory element 340 can be formed within the recession 350 in the metal line trench 320, for example, with electrochemical-plated copper. Optionally, a via 360 can be formed over the memory element 340. The via 360 can formed through an insulating material disposed on a substrate and/or between conductive layers. The via 360 can be formed by employing any standard technique. For example, the via 360 can be formed by a lithography process followed by etching. Lithography can use both positive and negative resists, which are available commercially. Lithographic techniques for forming vias in a dielectric are well known in the art.

Figure 7:
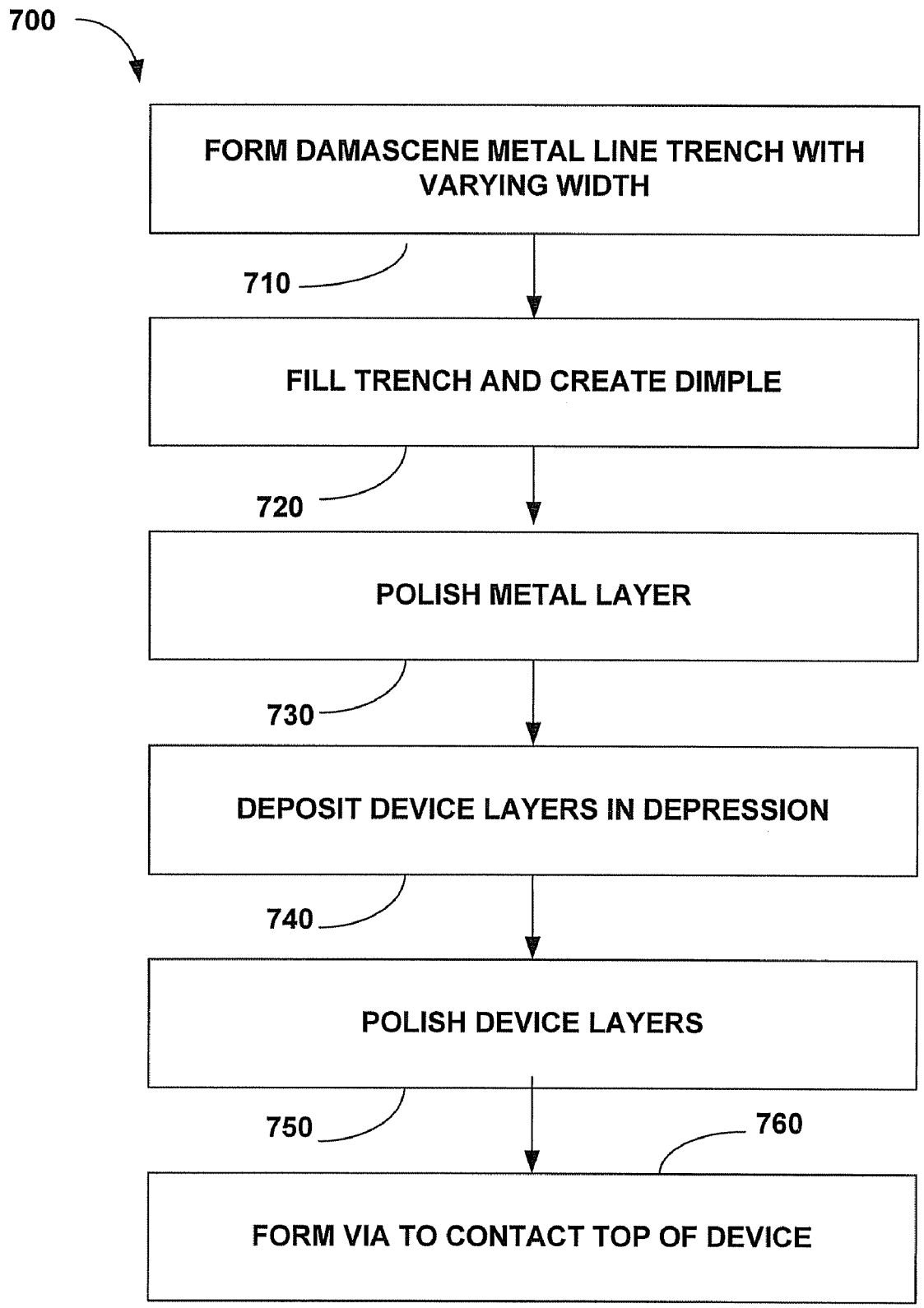
FIG. 7 illustrates an exemplary flow diagram of a method according to one aspect of the subject invention.

Turning now to FIG. 7, a flow diagram is shown according to an exemplary method 700 for formation of a memory element in a recession in a metal line. At reference numeral 710, a damascene metal line trench of varying width is created. One approach in accordance with an aspect of the invention is to etch a metal line trench upon, for example, a dielectric layer. At 720, the metal line trench is filled with ECP Cu. Deposition of the ECP Cu can be associated with a desired deposition thickness such that the narrow portion of the trench would seam close while the wide portion would be wide enough that the deposition would not fill it completely and thus leave a dimple. As a consequence, the wider portions of the trench will be partially filled with ECP Cu and the narrow portions are filled completely by seam formation, and the partially filled wider portions create a dimple in comparison to the surface of the dielectric layer by not filling completely with ECP Cu.

At 730, the metal film can be polished. Single and/or multiple memory device layers can be deposited onto the polished metal film residing in the wide portion of the metal line trench at 740. At reference numeral 750, the device layers can be polished and at 760 a via is formed in contact with the top of the device inserted in the dimple. Vias are generally formed through an insulating material disposed on a substrate or between conductive layers. The via can be formed by employing any standard technique. For example, the via can be formed by a lithography process followed by etching. Lithography can use both positive and negative resists, which are available commercially. Lithographic techniques for forming vias in a dielectric are well known in the art. Any etching process can be used for forming the via. For example, a plasma etch can be used to form the via. Plasma etch can take place in a parallel plate reactor using an ion-assisted reactant. The resist is completely removed from the dielectric surface and the inside walls of the via by plasma etching. The via can have relatively vertical sidewalls which extend perpendicular to the topological surface of the dielectric layer.

Figure 8:
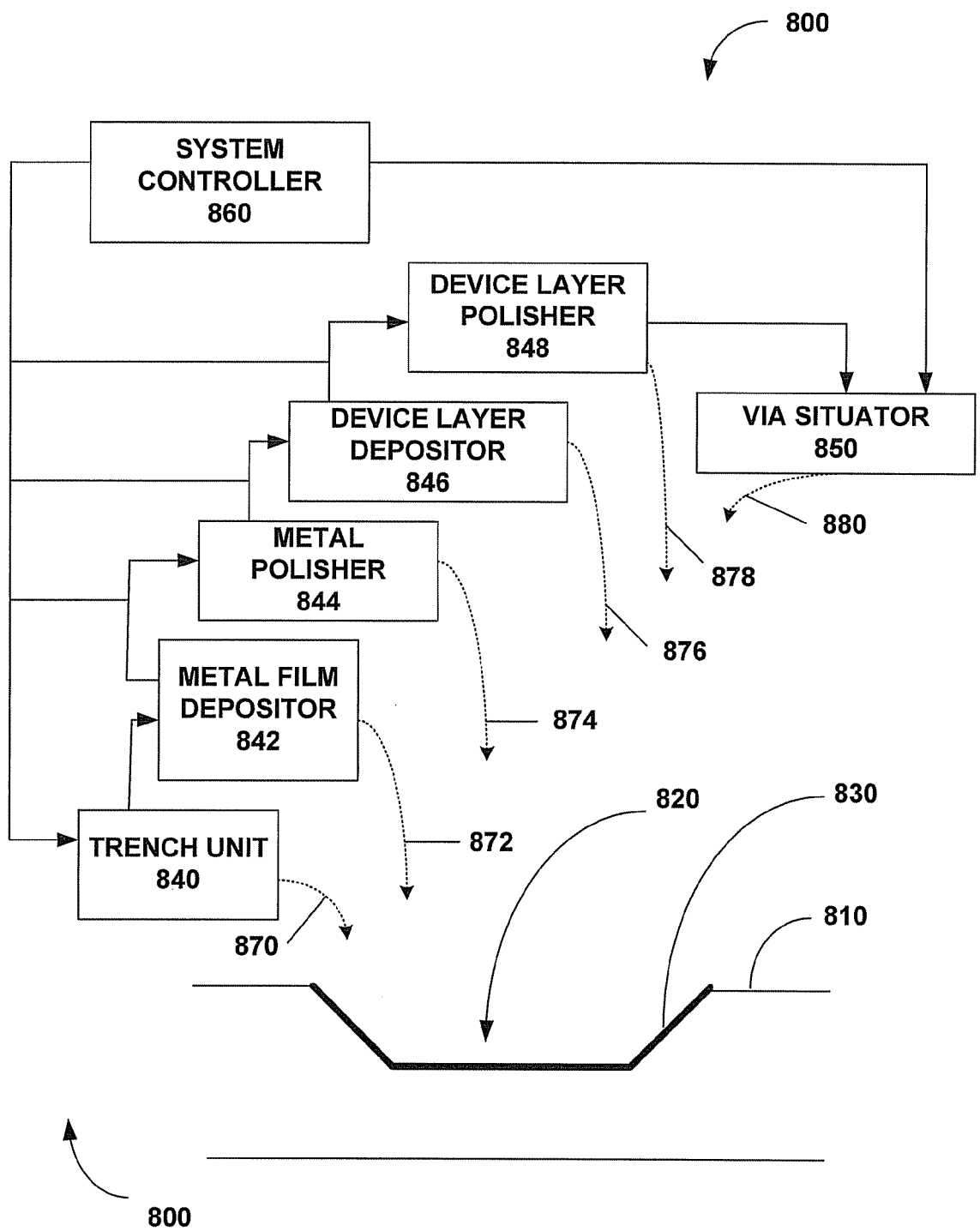
FIG. 8 illustrates a low level schematic block diagram illustrating a system for formation of a memory element in an indentation located on a surface of a memory structure.

Turning to FIG. 8, a low level schematic block diagram illustrating a system 800 for formation of a memory element in an indentation located on a surface is presented in accordance with an aspect of the subject invention. The system 800 acts upon a given semiconductor substrate 810, with a metal line trench 820, and a metal film 830 of copper (ECP Cu) deposited in the trench. The system 800 includes a trench unit 840, a metal film depositor 842, a metal polisher 844, a device layer depositor 846, a device layer polisher 848, a via situator 850 and a system controller 860. The system 800 further includes a trench process parameter 870, a film deposition parameter 872, a metal polish parameter 874, a layer deposition parameter 876, a device layer polish parameter 878, and a via parameter 880.

It should be noted that while six distinct system components 840–860 are illustrated in FIG. 8, such illustration is not intended to fix and/or limit the inclusion of additional components in the system 800. Illustrated components and/or other components can implement, for example, process initialization, process transition, process termination, and/or error handling. Also, while six system components 840–860 are illustrated individually, they may be coupled and/or combined with one or more components throughout the system, such configurations between one or more components can allow for the execution of system processes in conjunction, and/or serially, and/or repetitively. It is also understood that while a certain number of parameters 870, 872, 874, 876, 878 and 880 are depicted in FIG. 8, such depiction does not fix and/or limit the quantity and/or type of parameters that can be employed in other embodiments of the subject invention.

The system controller 860 can provide for various system requirements relating to the coordination and/or management of the system 800 (e.g. power supply, memory, adjustment and/or execution of system parameters, process parameter modification, process intervals, process termination, process transition, feedback-control execution, data storage, data input, data output). For example, the controller 860 can directly and/or indirectly control the metal film depositor 842, thereby allowing a user to pre-define and/or modify the duration and extent of the metal film deposition process. It should be further acknowledged that the system controller 860 can be optimized by the addition of a monitor unit for in-situ monitoring at any stage of system 800 processes, such as, for example, the characteristics of the metal film 830 created in a wide portion of a metal line trench 820.

The trench unit 840 executes a damascene metal line trench fabrication process upon the substrate 810. The substrate 810 may be, for example, a dielectric layer. The trench 820 created by the trench unit 840 has a varying width (e.g., narrow and wide regions). As an example, a cross-section of the substrate 810 at a wide portion of the trench 820 is shown in FIG. 8. The metal film depositor 842 deposits a metal film 830, for example, electrochemical plated copper, into the trench 820. As previously discussed, such deposition can be executed according to a pre-determined deposition thickness such that the wide trench portions will be partially filled with metal film 830, thereby creating a dimple in the trench 820 relative to the surface of the substrate 810. It is to be understood that the system 800 and/or the metal film depositor 842 can include a module (not shown) for programming and/or selecting the deposition thickness.

The metal polisher 844 polishes the metal film 830 after film deposition. For the sake of brevity, the polishing process employed by the polisher 844 will not be discussed herein, however, it is understood that a polishing process implemented by the system 800 can be any metal film polishing technique known in the art. The device layer depositor 846 can deposit one or more memory device layers upon the dimple created by the metal film 830 in wide portions of the metal line trench 820. After device layer deposition, the device layer polisher 848 can polish each device layer individually and/or polish a grouping of layers.

After layer polishing, the via situator 850 places a via in contact with the top of the device inserted in the dimple. Vias are generally formed through an insulating material disposed on a substrate or between conductive layers. The via can be formed by employing any standard technique. For example, the via can be formed by a lithography process followed by etching. Lithography can use both positive and negative resists, which are available commercially. Lithographic techniques for forming vias in a dielectric are well known in the art. Any etching process can be used for forming the via. For example, a plasma etch can be used to form the via.

Figure 9:
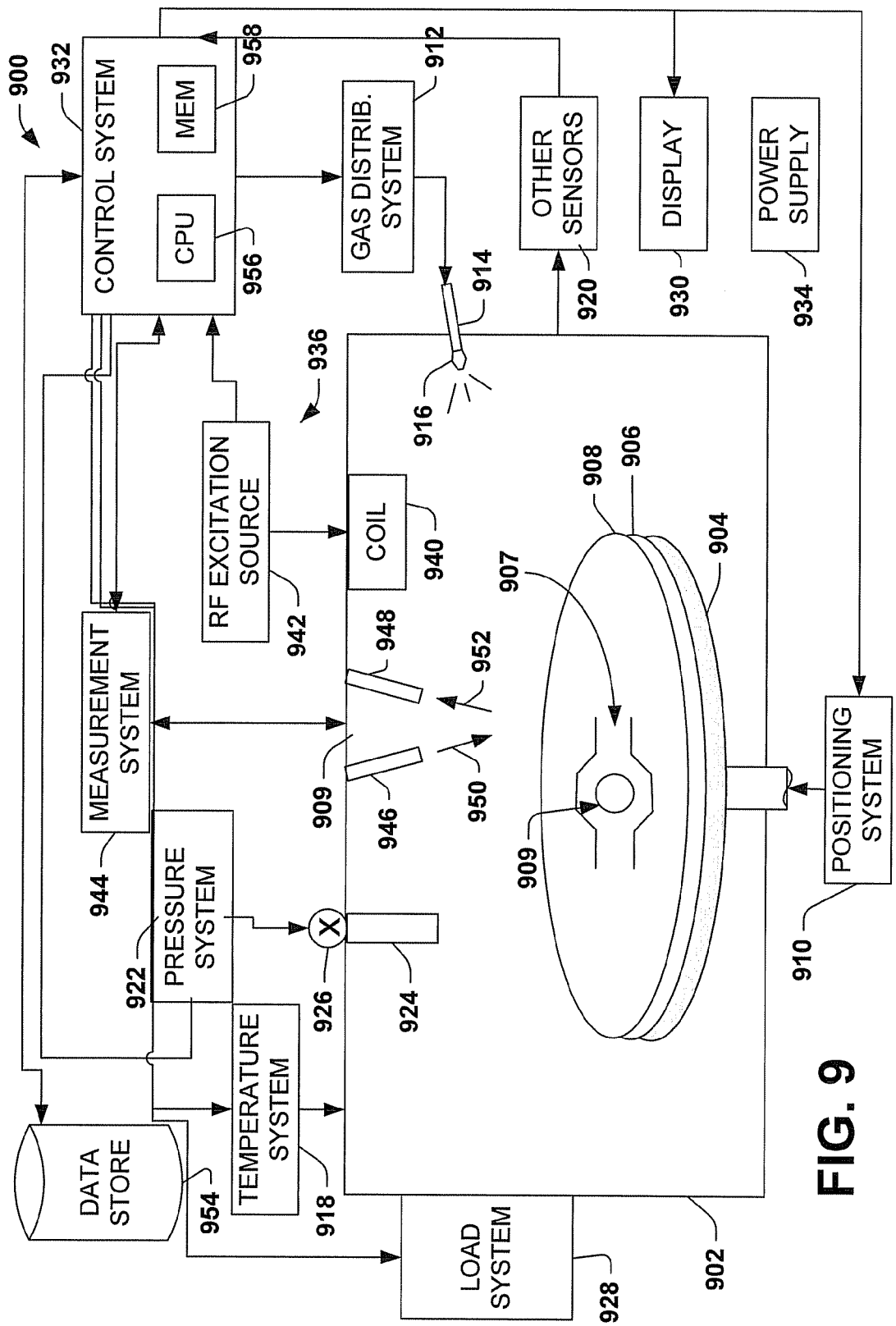
FIG. 9 illustrates a schematic block diagram for depositing metal film in a metal line trench on a dielectric layer in the manufacture of one or more memory elements in accordance with one or more aspects of the subject invention

Referring now to FIG. 9, a schematic block diagram is illustrated that depicts a system 900 for forming a memory element in a recessed metal line in accordance with one or more aspects of the subject invention. It will be appreciated that formation rates may vary in response to factors including, but not limited to, gas compositions and/or concentrations, excitation voltages, temperatures and/or pressures. The formation described herein can be utilized as part of a semiconductor fabrication process wherein one or more memory elements are produced on a wafer.

The system 900 comprises a chamber 902 defined by a housing having a plurality of walls. The chamber 902 includes a support, such as may include a stage 904 (or chuck) operative to support a wafer 906 which comprises a dielectric layer 908 upon which one or more depressions 909 of metal film (e.g. ECP Cu) can be formed on one or more damascene metal line trenches 907 in the layer 908. A positioning system 910 is operatively connected to the support 904 for selectively maneuvering the wafer 906 into desired positions within the chamber 902. It is to be appreciated that any suitable positioning system may be employed in accordance with one or more aspects of the subject invention. It is to be further appreciated that the wafer 906 can comprise of a variety of layers and/or materials used during semiconductor fabrication. For example, the wafer can include a passive layer, electrode layer, organic polymer layer and/or a layer of conductive material such as aluminum, chromium, germanium, gold, magnesium, manganese, indium, iron, nickel, palladium, platinum, silver, titanium, zinc, alloys thereof, indium-tin oxide, polysilicon, doped amorphous silicon, metal silicides, and the like. Examples of alloys that can be utilized for the conductive material include Hastelloy®, Kovar®, Invar, Monel®, Inconel®, brass, stainless steel, magnesium-silver alloy, and various other alloys.

A gas distribution system 912 is operatively coupled to the chamber 902 for selectively providing gaseous chemicals into the chamber at various rates, volumes, concentrations, etc., based upon, among other things, etching process parameters, the deposition thickness of metal film to be deposited, the composition of film(s) to be deposited, the pressure within the chamber, the temperature within the chamber and/or the size of the chamber, for example. By way of illustration, the gas distribution system 912 includes one or more sources of gaseous medium (a vapor) of one or more chemical(s). In the example illustrated, the gases are provided into the chamber through a conduit 914 that terminates in a nozzle 916. While, for purposes of brevity, a single nozzle 916 is shown in FIG. 9, it is to be appreciated that more than one nozzle or other gas delivery mechanisms may be utilized to provide gas into the chamber 902 at various mixtures and/or concentrations in accordance with one or more aspects of the subject invention. For example, a gas distribution system 912 can be implemented to more evenly provide chemicals into the chamber above the wafer 906, which can facilitate a more controlled metal film deposition process. It will be appreciated that other gases and/or solutions can be injected into the chamber to facilitate depositing metal film in accordance with the subject invention.

A temperature system 918 also is provided for selectively regulating the temperature within the chamber 902. For example, the temperature system 918 may implement its own temperature control process or such control may be implemented as part of other sensors 920 operatively associated with an etching process, for example, within the chamber 902. A pressure system 922 is also included in the system to selectively regulate the pressure within the chamber. The pressure system 922 may include, for example, one or more vent conduits 924 having valves 926 that may be controllably opened and/or closed to varying degrees to assist with selectively adapting the pressure within the chamber 902.

The system 900 can also include a load system 928 operatively connected to the chamber 902 for loading and unloading wafers into and out of the chamber 902. The load system 928 typically is automated to load and unload the wafers into the chamber at a controlled rate and/or intermittent rate. The system further may include a display 930 operatively coupled to a control system 932 for displaying a representation (e.g., graphical and/or textual) of one or more operating parameters (e.g., temperature within the chamber, pressure within the chamber, thickness of material deposited, chart of rate of material being deposited).

A power supply 934 is included to provide operating power to components of the system 900. Any suitable power supply (e.g., battery, line power) suitable for implementation with the subject invention can be utilized. An excitation system 936 is operatively associated with the chamber 902. The system 936 includes a coil 940 and an RF excitation (e.g., voltage) source 942 wherein the coil 940 is excited by the RF excitation source 942 which in turn electrically excites one or more gases within the chamber to facilitate dispersion of one or more gases.

The system can also include a measurement system 944 for in-situ monitoring of processing within the chamber 902, such as, for example, thickness of film being deposited at wide portions of the metal trench 907. The monitoring system 944 can be a standalone component and/or can also be distributed between two or more cooperating devices and/or processes. Similarly, the monitoring system 944 can reside in one physical or logical device (e.g., computer, process) and/or be distributed between two or more physical or logical devices. The measurement system 944 includes one or more non-destructive measurement components, such as may utilize optical interference, scatterometry, IR spectroscopy, ellipsometry, scanning electron microscopy, synchrotron and/or x-ray diffraction techniques. The measurement system includes a beam source 946 and detector 948. It is to be appreciated that while one beam source 946 and one beam detector 948 are shown in the example illustrated, more than one of these components may be included to measure film thickness and/or compositions, for example, at various locations on the wafer 906. The source portion 946 provides one or more beams of light 950 from, for example, a frequency stabilized laser, laser diode or helium neon (HeNe) gas laser, toward the surface of the dielectric layer 908 on the wafer 906 whereon the one or more trenches 907 are created. The beam 950 can interact with the metal film in the trench 907 and is altered thereby (e.g., reflected, refracted, and diffracted). The altered beam(s) 952 is received at the detector portion 948 of the measurement system 944 and has beam properties (e.g., magnitude, angle, phase, polarization), which can be examined relative to that of the incident beam(s) 950 to determine an indication of one or more properties of the film being deposited (e.g., thickness, chemical species). A plurality of incident beams from one or more sources directed at different spaced apart locations may be employed, for example, to yield corresponding measurements of film thickness at these locations substantially concurrently during the process. The concurrent measurements, in turn, may provide an indication of depression depth and may be useful in providing information for device layer deposition and/or controlling the various system 900 processes to efficiently and economically achieve desired results and mitigate the need for and/or degree of subsequent processing steps, such as, for example, selective re-deposition of metal film in narrow portions of the trench and/or chemical mechanical polishing at particular locations on the wafer.

Figure 10:
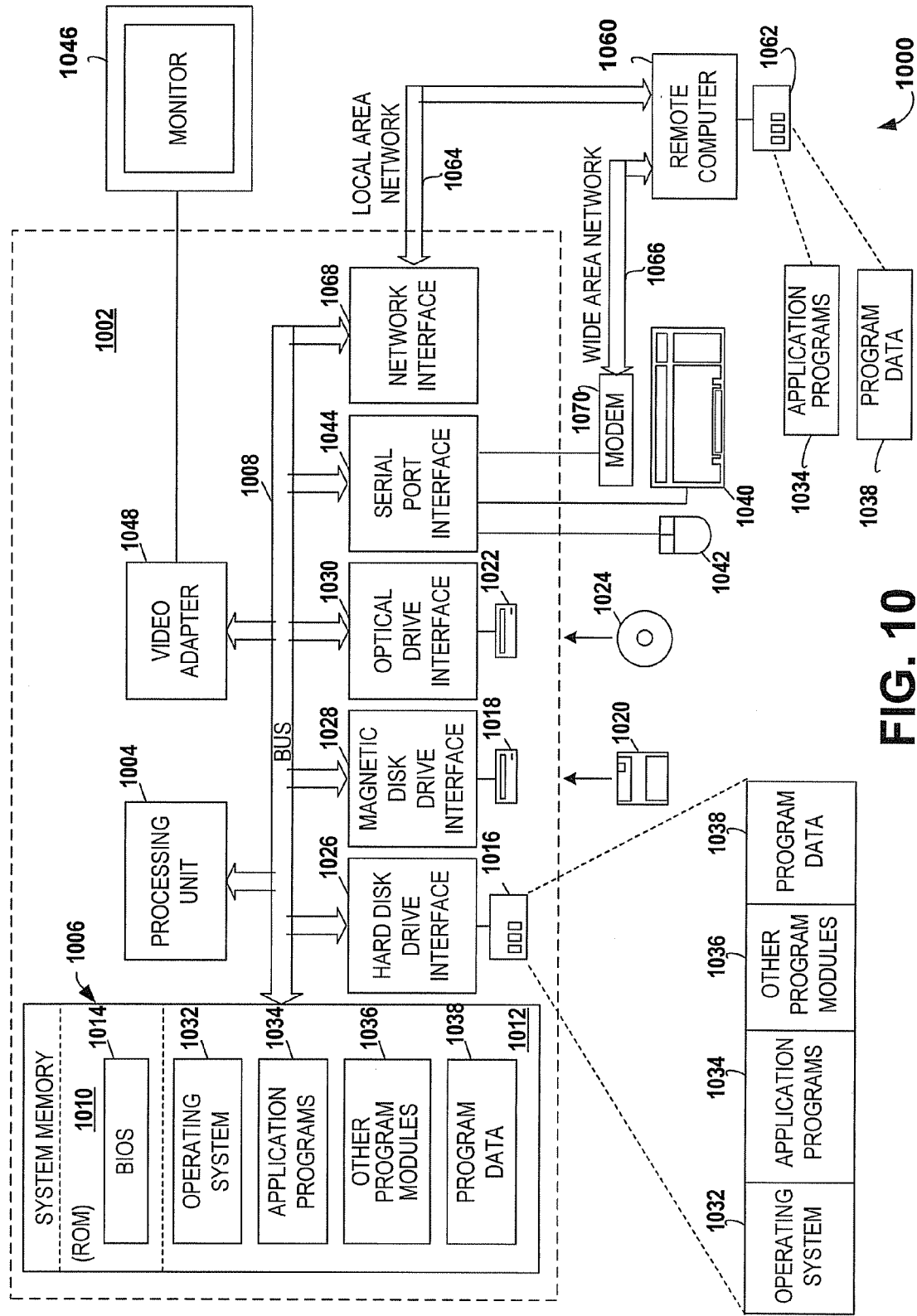
FIG. 10 illustrates representative computing and operational environments in accordance with the subject invention.

In order to provide additional context for various aspects of the present invention, FIG. 10 and the following discussion are intended to provide a brief, general description of a suitable computing environment 1000 in which the various aspects of the subject invention can be implemented. While the invention has been described above in the general context of computer-executable instructions that may run on one or more computers, those skilled in the art will recognize that the invention also may be implemented in combination with other program modules and/or as a combination of hardware and software. Generally, program modules include routines, programs, components, data structures, etc. that perform particular tasks or implement particular abstract data types. Moreover, those skilled in the art will appreciate that the inventive methods may be practiced with other computer system configurations, including single-processor or multiprocessor computer systems, minicomputers, mainframe computers, as well as personal computers, hand-held computing devices, microprocessor-based or programmable consumer electronics, and the like, each of which may be operatively coupled to one or more associated devices. The illustrated aspects of the invention may also be practiced in distributed computing environments where certain tasks are performed by remote processing devices that are linked through a communications network. In a distributed computing environment, program modules may be located in both local and remote memory storage devices.

With reference to FIG. 10, an exemplary system environment 1000 for implementing the various aspects of the invention includes a conventional computer 1002, including a processing unit 1004, a system memory 1006, and a system bus 1008 that couples various system components, including the system memory, to the processing unit 1004. The processing unit 1004 may be any commercially available or proprietary processor. In addition, the processing unit may be implemented as multi-processor formed of more than one processor, such as may be connected in parallel.

The system bus 1008 may be any of several types of bus structure including a memory bus or memory controller, a peripheral bus, and a local bus using any of a variety of conventional bus architectures such as PCI, VESA, Microchannel, ISA, and EISA, to name a few. The system memory 1006 includes read only memory (ROM) 1010 and random access memory (RAM) 1012. A basic input/output system (BIOS) 1014, containing the basic routines that help to transfer information between elements within the computer 1002, such as during start-up, is stored in ROM 1010.

The computer 1002 also may include, for example, a hard disk drive 1016, a magnetic disk drive 1018, e.g., to read from or write to a removable disk 1020, and an optical disk drive 1022, e.g., for reading from or writing to a CD-ROM disk 1024 or other optical media. The hard disk drive 1016, magnetic disk drive 1018, and optical disk drive 1022 are connected to the system bus 1008 by a hard disk drive interface 1026, a magnetic disk drive interface 1028, and an optical drive interface 1030, respectively. The drives 1016, 1018, and 1022 and their associated computer-readable media provide nonvolatile storage of data, data structures, computer-executable instructions, etc. for the computer 1002. Although the description of computer-readable media above refers to a hard disk, a removable magnetic disk and a CD, it should be appreciated by those skilled in the art that other types of media which are readable by a computer, such as magnetic cassettes, flash memory cards, digital video disks, Bernoulli cartridges, and the like, can also be used in the exemplary operating environment 1000, and further that any such media may contain computer-executable instructions for performing the methods of the subject invention.

A number of program modules may be stored in the drives 1016, 1018, and 1022 and RAM 1012, including an operating system 1032, one or more application programs 1034, other program modules 1036, and program data 1038. The operating system 1032 may be any suitable operating system or combination of operating systems. By way of example, the application programs 1034 and program modules 1036 can include inferring a location of a device in accordance with an aspect of the subject invention.

A user can enter commands and information into the computer 1002 through one or more user input devices, such as a keyboard 1040 and a pointing device 1042 (e.g., a mouse). Other input devices (not shown) may include a microphone, a joystick, a game pad, a satellite dish, wireless remote, a scanner, or the like. These and other input devices are often connected to the processing unit 1004 through a serial port interface 1044 that is coupled to the system bus 1008, but may be connected by other interfaces, such as a parallel port, a game port or a universal serial bus (USB). A monitor 1046 or other type of display device is also connected to the system bus 1008 via an interface, such as a video adapter 1048. In addition to the monitor 1046, the computer 1002 may include other peripheral output devices (not shown), such as speakers, printers, etc.

It is to be appreciated that the computer 1002 can operate in a networked environment using logical connections to one or more remote computers 1060. The remote computer 1060 may be a workstation, a server computer, a router, a peer device or other common network node, and typically includes many or all of the elements described relative to the computer 1002, although, for purposes of brevity, only a memory storage device 1062 is illustrated in FIG. 10. The logical connections depicted in FIG. 10 can include a local area network (LAN) 1064 and a wide area network (WAN) 1066. Such networking environments are commonplace in offices, enterprise-wide computer networks, intranets and the Internet.

When used in a LAN networking environment, for example, the computer 1002 is connected to the local network 1064 through a network interface 1068 or adapter (not shown). When used in a WAN networking environment, the computer 1002 typically includes a modem 1070 (e.g., telephone, DSL, cable, etc.), or is connected to a communications server on the LAN, or has other means for establishing communications over the WAN 1066, such as the Internet. The modem 1070, which can be internal or external relative to the computer 1002, is connected to the system bus 1008 via the serial port interface 1044. In a networked environment, program modules (including application programs 1034) and/or program data 1038 can be stored in the remote memory storage device 1062. It will be appreciated that the network connections shown are exemplary and other means (e.g., wired or wireless) of establishing a communications link between the computers 1002 and 1060 can be used when carrying out an aspect of the subject invention.

In accordance with the practices of persons skilled in the art of computer programming, the subject invention has been described with reference to acts and symbolic representations of operations that are performed by a computer, such as the computer 1002 or remote computer 1060, unless otherwise indicated. Such acts and operations are sometimes referred to as being computer-executed. It will be appreciated that the acts and symbolically represented operations include the manipulation by the processing unit 1004 of electrical signals representing data bits which causes a resulting transformation or reduction of the electrical signal representation, and the maintenance of data bits at memory locations in the memory system (including the system memory 1006, hard drive 1016, floppy disks 1020, CD-ROM 1024, and remote memory 1062) to thereby reconfigure or otherwise alter the computer system's operation, as well as other processing of signals. The memory locations where such data bits are maintained are physical locations that have particular electrical, magnetic, or optical properties corresponding to the data bits.

In view of the exemplary systems shown and described above, a methodology, which may be implemented in accordance with the subject invention, will be better appreciated with reference to the flow diagram of FIG. 10. While, for purposes of simplicity of explanation, the methodology of FIG. 10 is shown and described as executing serially, it is to be understood and appreciated that the subject invention is not limited by the illustrated order, as some blocks may, in accordance with the subject invention, occur in different orders and/or concurrently with other blocks from that shown and described herein. Moreover, not all illustrated blocks may be required to implement a methodology in accordance with the subject invention.

What have been described above are one or more aspects of the present invention. It is, of course, not possible to describe every conceivable combination of components or methodologies for purposes of describing the subject invention, but one of ordinary skill in the art will recognize that many further combinations and permutations of the subject invention are possible. Accordingly, the subject invention is intended to embrace all such alterations, modifications and variations that fall within the spirit and scope of the appended claims. In addition, while a particular feature of the invention may have been disclosed with respect to only one of several implementations, such feature may be combined with one or more other features of the other implementations as may be desired and advantageous for any given or particular application.

What is claimed is:

1. A memory structure, comprising:
   a semiconductor substrate with a metal line trench that includes at least one narrow portion and at least one wide portion with a dimple; and
   a selection element formed within the dimple.

2. The memory structure of claim 1, the selection element and the at least one wide portion of the metal line trench are formed within a similar layer.

3. The memory structure of claim 1, the metal line trench is comprised of electrochemical-plated copper.

4. The memory structure of claim 1, the metal line trench has a deposition thickness such that the at least one narrow portion is substantially filled by seam formation.

5. The memory structure of claim 1, a surface of the metal line trench and/or a layer in which the selection element is formed is polished.

6. The memory structure of claim 1, the selection element is a diode.

7. The memory structure of claim 1, further comprising a via formed over a layer in which the selection element is formed to construct an interconnect.

8. The memory structure of claim 1, the semiconductor substrate includes one or more insulators, dielectrics, barriers, metal interconnects, and/or passivization layers.

9. The memory structure of claim 1, the metal line trench is formed via plasma etch, wet etch, or electro polishing.

10. The memory structure of claim 1, the semiconductor substrate further comprises a dielectric layer that is constructed of at least one of a deposited oxide, a silicon nitride, a polyimide film, organic dielectric materials, inorganic dielectric materials, low k dielectrics, high k dielectrics, polymeric materials, amorphous materials, crystalline materials, monomeric materials; or a silicon containing spin-on glasses, comprising at least one of an alkoxysilane polymer, a siloxane polymer, a silsesquioxane polymer, a poly (arylene ether), a fluorinated poly(arylene ether), polymer dielectrics, or nanoporous silica.

11. The memory structure of claim 10, the dielectric layer is formed by one of chemical vapor deposition (CVD), plasma enhanced chemical vapor deposition (PECVD), low pressure chemical vapor deposition (LPCVD), or high pressure chemical vapor deposition (HPCVD).

12. The memory structure of claim 1, the metal line trench is a damascene metal line trench.

13. The memory structure of claim 1, the metal line trench is formed via a peroxide and/or acid based etchant.

14. The memory structure of claim 1, the dimple is of a size determined based on the thickness requirements of the selection element.

15. The memory structure of claim 1, a surface of the metal line trench and/or the selection element is polished.

16. The memory structure of claim 1, further comprising an interconnect, the interconnect formed over a layer in which the selection element is constructed.

17. The memory structure of claim 16, the interconnect is a via formed through a lithography process.

* * * * *